United States Patent [19]

Nakamura

[11] Patent Number: 4,970,761
[45] Date of Patent: Nov. 20, 1990

[54] CIRCUIT BOARD ISOLATING FASTENER

[75] Inventor: Toshinobu Nakamura, Tokyo, Japan

[73] Assignee: Shinagawa Shoko Co., Ltd., Tokyo, Japan

[21] Appl. No.: 518,234

[22] Filed: May 7, 1990

Related U.S. Application Data

[63] Continuation of Ser. No. 295,556, Jan. 11, 1989, abandoned.

[30] Foreign Application Priority Data

Jan. 19, 1988 [JP]  Japan .............................. 63-4292[U]

[51] Int. Cl.⁵ ............................................. F16B 13/04
[52] U.S. Cl. ....................................... 24/453; 24/607; 174/138 D; 411/60
[58] Field of Search ........................ 24/607, 453, 297; 174/138 D; 411/32, 33, 41, 40, 60, 57, 48, 45

[56] References Cited

U.S. PATENT DOCUMENTS

| | | |
|---|---|---|
| 4,007,516 | 2/1977 | Coules . |
| 4,114,509 | 9/1978 | Poe . |
| 4,502,193 | 3/1985 | Harmon et al. . |
| 4,647,262 | 3/1987 | Yokota ..................... 24/607 X |
| 4,674,930 | 6/1987 | Poe et al. .................... 24/607 X |
| 4,804,303 | 2/1989 | Statkus ....................... 411/41 |

FOREIGN PATENT DOCUMENTS 371927  10/1963  Switzerland ......................... 24/297

*Primary Examiner*—James R. Brittain
*Attorney, Agent, or Firm*—Fidelman & Wolffe

[57] ABSTRACT

A fastener for securing a circuit board to a chassis or another circuit board of an electronic appliance in a spaced relationship by a predetermined fixed distance. The fastener comprises a plunger having an inverted pyramid-shaped head and a rod extending downwardly from said head, and a fastener body including an isolating member having at the center thereof an opening for receiving said plunger therein and a pair of locking members located at the opposite ends of said isolating member with a pair of support plates interposed therebetween. When the plunger is inserted into the fastener body, the locking members are expanded outwardly by the plunger so that a circuit board and a chassis or another circuit board are secured to each other in a predetermined spaced relationship.

9 Claims, 7 Drawing Sheets

CIRCUIT BOARD ISOLATING FASTENER

This application is a continuation of U.S. application Ser. No. 07/295,556 filed Jan. 11, 1989, abandoned.

BACKGROUND OF THE INVENTION

This invention relates to a fastener for securing a circuit board to a chassis or another circuit board of an electronic appliance in a spaced relationship by a predetermined fixed distance from each other.

Electronic appliances often employ means for securing a circuit board to a chassis or another circuit board in a spaced relationship by a predetermined fixed distance from each other. FIG. 1 shows an exemplary one of such means wherein a hollow tubular member a is interposed between a circuit board A and a chassis B and a bolt b is fitted in and extends through the hollow of the tubular member a and fastens the circuit board A and the chassis B to each other with a nut c screwed thereon. Another exemplary means is shown in FIG. 2 wherein a hollow tubular member a is interposed between a circuit board A and a chassis B and a pair of bolts b are screwed into the opposite end portions of a threaded hollow of the tubular member a to fasten the circuit board A and the chassis B to each other. The two means described above commonly have a drawback that, since the head d of the bolt b or each of the bolts b is projected to the outside of the circuit board A, the head d frequently contacts with some part on the circuit board A to cause short-circuiting. The means also have a common drawback that much time is required for assembly using the same. Such a means as shown in FIG. 3 is also conventionally employed wherein a head d of such a bolt as described above is accommodated in an accommodating member e so as not to be projected to the outside of a circuit board A. The means, however, has drawbacks that such an accommodating member e for accommodating the head d of a bolt is required in addition to a hollow tubular member a and that a step of producing the accommodating member e is additionally required, resulting in increase in production cost.

Recently, such an isolating fastener as shown in FIG. 4 has been proposed and is now in practical use. A fastener of the type shown is superior to the conventional isolating members described above in that the production cost is comparatively low because it is formed by integral molding of a synthetic resin material and that a circuit board A can be secured to a chassis B in a spaced relationship by a predetermined fixed distance only by fitting the opposite end portions of the fastener into perforations in the circuit board A and the chassis B, and accordingly the operation efficiency is high. With the fastener of the type described just above, fixation of the same to the circuit board A only makes use of resiliency of fixing fingers h which are provided at the top of the fastener and normally resiliently urged outwardly or upwardly from the position shown in FIG. 4 while fixation to the chassis B is attained by a wing band g and a plurality of contact elements i provided at lower portions of the fastener. Accordingly, the fastener has a drawback that it cannot stand use for a long period of time and it is particularly unsuitable for use with an electronic appliance of an aircraft or a car.

SUMMARY OF THE INVENTION

It is an object of the present invention to provide a circuit board isolating fastener which can be assembled to secure a circuit board to a chassis or another circuit board in a spaced relationship by a predetermined fixed distance by a simple operation and which can stand use for a long period of time without being damaged by vibrations of the associated parts.

A circuit board isolating fastener according to the present invention comprises a fastener body including an isolating member and a pair of locking members provided at the opposite ends of the isolating member with a pair of support plates interposed therebetween, and a plunger adapted to be inserted in the center of the fastener body. The isolating member has such a length as to allow a circuit board and a chassis or another circuit board to be isolated from each other in a spaced relationship by a predetermined fixed distance, and the support plates for supporting the circuit board and the chassis or another circuit board thereon are located at the opposite ends of the isolating member while the locking members are located on the outer sides of the support plates.

The plunger is formed from a rod having an inverted pyramid-shaped head at an end thereof. The plunger is inserted in holes provided at the centers of the locking members of the fastener body. Upon such insertion, one of the locking members of the fastener body is expanded outwardly by a terminal end of the rod of the plunger so that it is secured to the chassis, and the other locking member is expanded outwardly by a pair of opposing side faces of the inverted pyramid-shaped portion of the head of the plunger so that it is secured to the circuit board.

Further, a projection is formed on the inverted pyramid-shaped portion of the plunger such that it is fitted, when the plunger is inserted into the fastener body, into a pair of grooves formed in opposing inner walls of the one locking member adjacent a slit formed in the locking member. Meanwhile, an annular projection is formed on the rod of the plunger such that it is contacted, when the plunger is inserted into the fastener body, with one of the support plates to prevent coming off of the plunger from the fastener body.

The fastener body and the plunger of the circuit board isolating member according to the present invention are each formed by integral molding of a nonconductive elastic material. While are commonly molded by injection molding of a synthetic resin material, they may otherwise be molded by some other process such as casting.

Since the circuit board isolating fastener according to the present invention has such a construction as described above, when it is intended to secure a circuit board to a chassis or another circuit board in a mutually isolating relationship, such fixation can be attained very readily using the circuit board isolating fastener. Further, once the fixation is established, the circuit board isolating fastener will not be loosened by vibrations. Besides, it is also an advantage that the circuit board can be removed very readily from the chassis or another circuit board.

The above and other objects, features and advantages of the present invention will become apparent from the following description and the appended claims, taken in conjunction with the accompanying drawings.

BRIEF DESCRIPTION OF THE PREFERRED EMBODIMENTS

Figure 1:
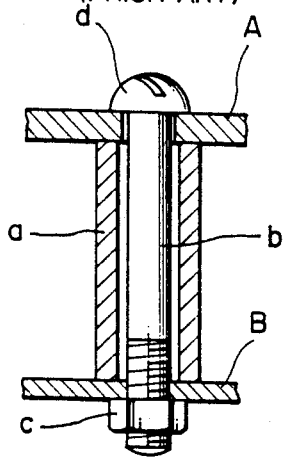
FIG. 1 to 4 are side elevational views, partly in section, showing several conventional circuit board isolating members.
Figure 2:
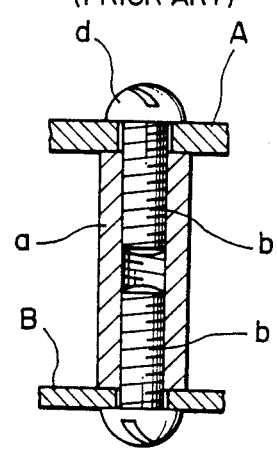
Figure 3:
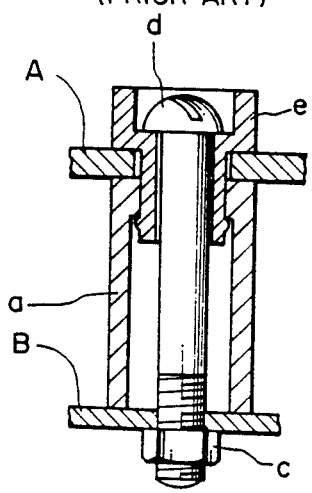
Figure 4:
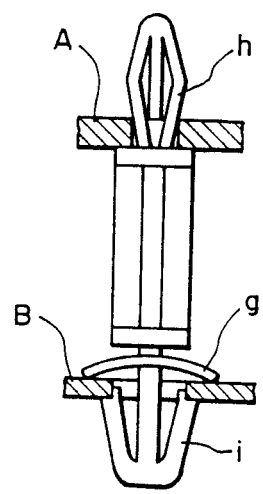
Figure 5:
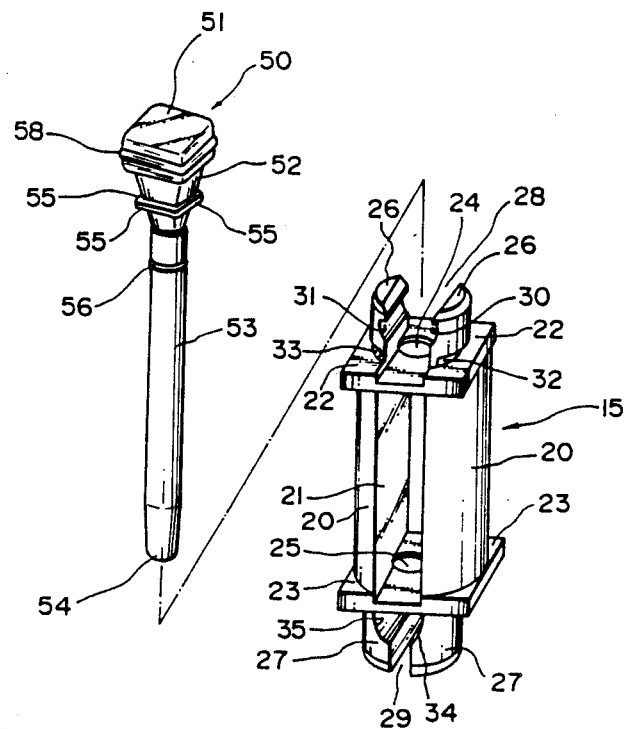
FIG. 5 is a fragmentary perspective view showing a preferred embodiment of circuit board isolating fastener according to the present invention.
Figure 6:
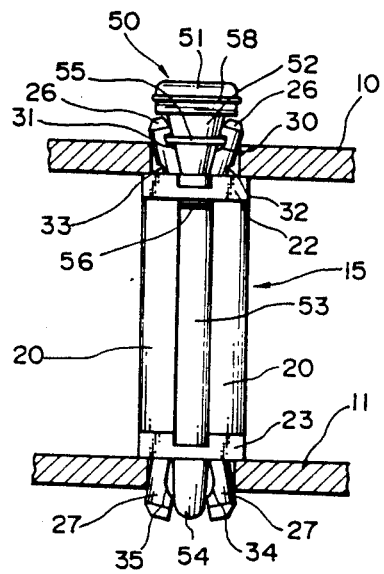
FIG. 6 is a side elevational view, partly in section, of the circuit board isolating fastener shown in FIG. 5.

Referring first to FIGS. 5 and 6, there is shown a circuit board isolating fastener according to a first preferred embodiment of the present invention. The circuit board isolating fastener shown includes a fastener body 15 having an isolating member 20 which has an opening 21 formed at the center thereof for permitting a rod 53 of a plunger 50 to pass therethrough. A pair of support plates 22 and 23 are disposed at the opposite ends of the isolating member 20 and have guide holes 24 and 25 formed at the central portions thereof, respectively, for permitting the rod 53 of the plunger 50 to pass therethrough. An upper locking member 26 is provided on an outer face of the support plate 22 while a lower locking member 27 is disposed on an outer face of the other support plate 23. The locking members 26 and 27 have slits 28 and 29 formed at the central portions thereof, respectively, for receiving the plunger 50 therein to expand the locking members 26 and 27 outwardly. A pair of grooves 30 and 31 are formed in opposing inner walls of the upper locking member 26 adjacent the slit 28 while a pair of recesses 32 and 33 are formed in outer walls of base portions of the upper locking member 26 to facilitate resilient outer expansion of the upper locking member 26. On the other hand, a pair of recesses 34 and 35 are formed in opposing inner walls of the lower locking member 27 adjacent the slit 29 for facilitating resilient outer expansion of the lower locking member 27 when the rod 53 of the plunger 50 is fitted into the slit 29.

The plunger 50 has a head 51 having an inverted pyramind-shaped portion 52. A projection 55 in the form of a small flange is formed on an outer periphery of the inverted pyramid-shaped portion 52 of the head 51 of the plunger 50. The rod 53 of the plunger 50 extends downwardly from the head 51 and has an annular projection or flange 56 formed therearound.

In FIG. 6, the plunger 50 is shown inserted in the fastener body 15. In the conditiong shown in FIG. 6, the lower locking member 27 of the fastener body 15 is expanded outwardly by a lower end 54 of the rod 53 of the plunger 50 while the upper locking member 26 is also expanded outwardly but by the inverted pyramid-shaped portion 52 of the head 51 of the plunger 50. The projection 55 of the inverted pyramid-shaped portion 52 of the plunger 50 is fitted in the grooves 30 and 31 of the upper locking member 26 while the annular projection 56 of the rod 53 of the plunger 50 is located on the inner side of or just below the upper support plate 22 of the fastener body 15 and thus acts to prevent coming off of the plunger 50 from the fastener body 15 which may be caused by vibrations. It is to be noted that an annular projection 58 is formed on an outer periphery of the head 51 of the plunger 50 for preventing slipping when the plunger 50 is pulled at the head 51 thereof off the fastener body 15.

Figure 7:
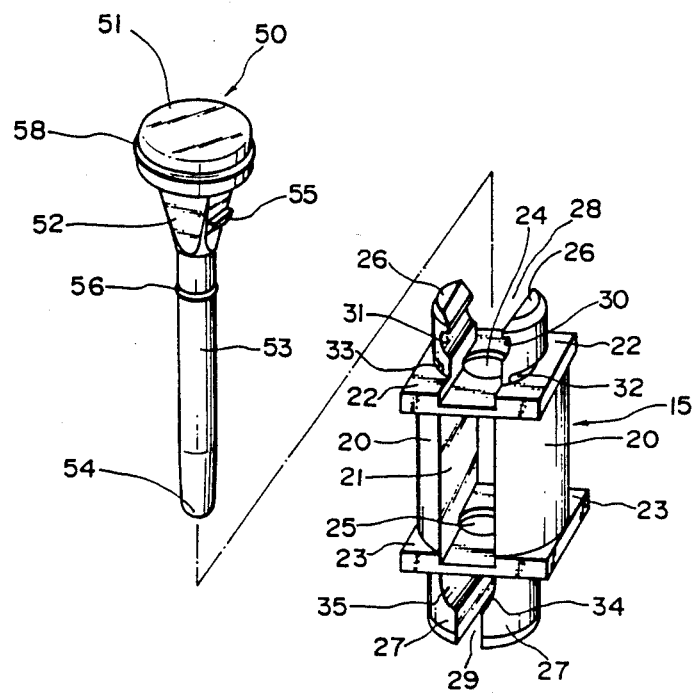
FIG. 7 is a fragmentary perspective view showing another preferred embodiment of circuit board isolating fastener according to the present invention.
Figure 8:
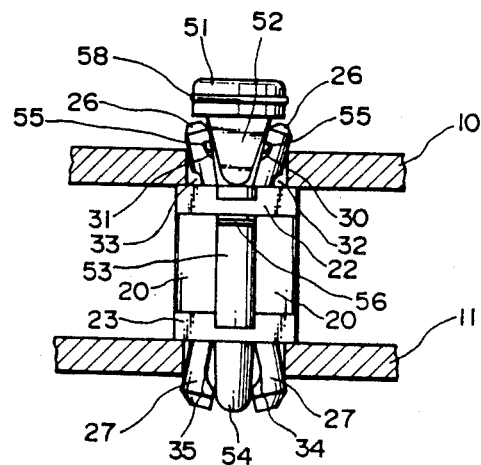
FIG. 8 is a side elevational view, partly in section, of the circuit board isolating fastener shown in FIG. 7.

Referring now to FIGS. 7 and 8, there is shown a circuit board isolating fastener according to a second preferred embodiment of the present invention. It is to be noted that, in FIGS. 7 and 8, like parts or elements are denoted by like reference numerals to those of FIGS. 5 and 6, and overlapping description thereof will be omitted herein to avoid redundancy (this also applies to the other embodiments described below). The circuit board isolating fastener shown in FIGS. 7 and 8 has a generally similar construction to the circuit board isolating fastener shown in FIGS. 5 and 6 but is different from the latter in that a pair of projections 55 for fitting in a pair of grooves 30 and 31 of an upper locking member 26 of a fastener body 15 are formed on the two opposite side faces of an inverted pyramidshaped portion 52 of a head 51 of a plunger 50.

Figure 9:
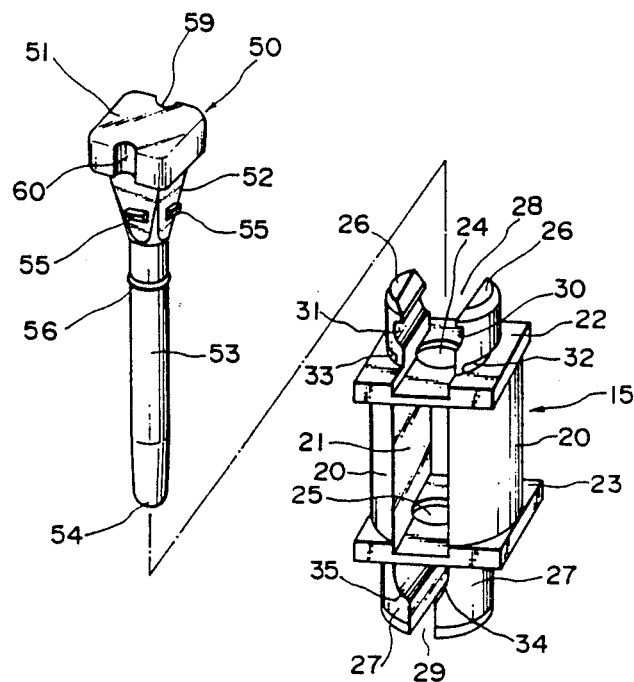
FIG. 9 is a fragmentary perspective view showing a further preferred embodiment of circuit board isolating fastener according to the present invention.
Figure 10:
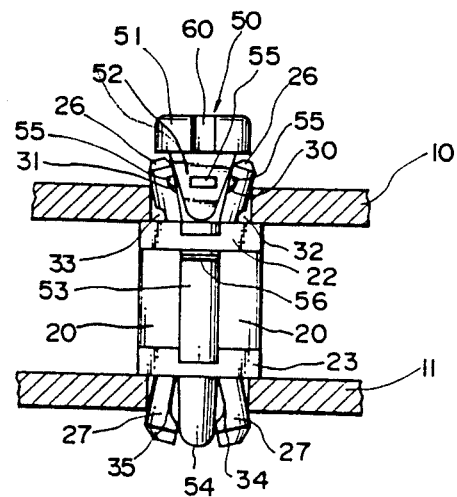
FIG. 10 is a side elevational view, partly in section, of the circuit board isolating fastener shown in FIG. 9.

FIGS. 9 and 10 show a circuit board isolating fastener according to a third preferred embodiment of the present invention. In the circuit board isolating fastener shown, a head 51 of a plunger 50 is not provided with such an annular projection 58 as described hereinabove but instead has a pair of recesses 59 and 60 formed in the opposite side walls thereof for preventing slipping.

Figure 11:
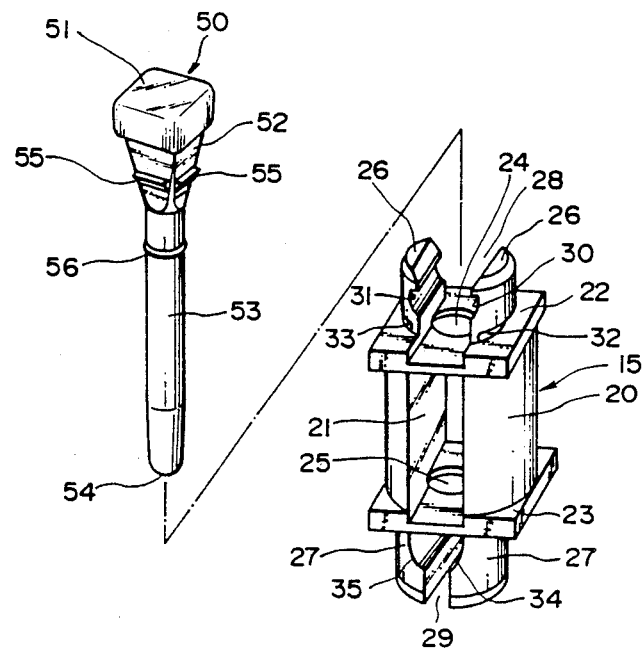
FIG. 11 is a fragmentary perspective view showing a still further preferred embodiment of circuit board isolating fastener according to the present invention.
Figure 12:
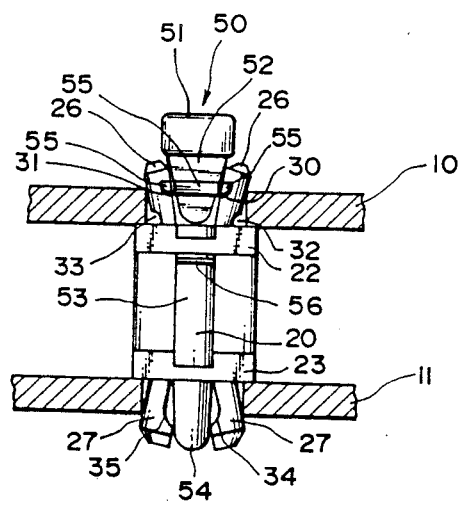
FIG. 12 is a side elevational view, partly in section, of the circuit board isolating fastener shown in FIG. 11.

FIGS. 11 and 12 show a circuit board isolating fastener according to a fourth preferred embodiment of the present invention wherein no such slipping preventing means as the projection 58 or the recesses 59 and 60 described hereinabove is provided for a head 51 of a plunger 50.

Figure 13:
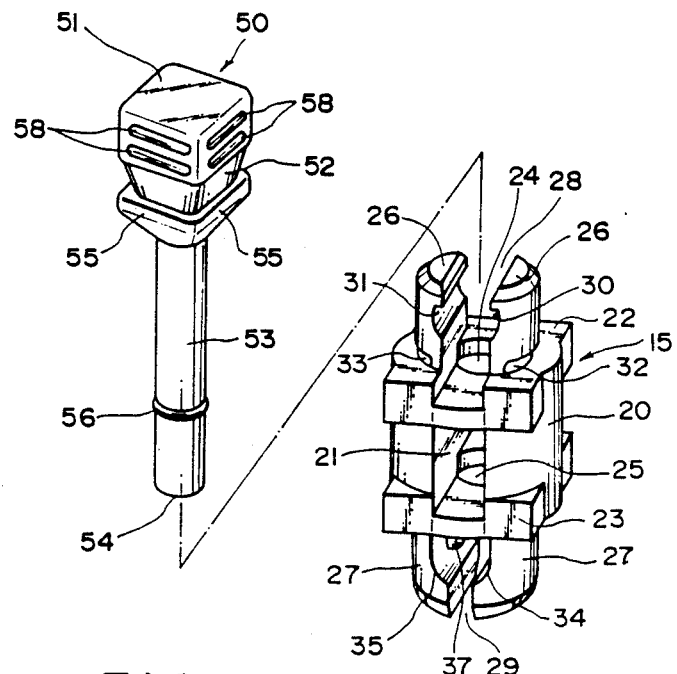
FIG. 13 is a fragmentary perspective view showing a yet further preferred embodiment of circuit board isolating fastener according to the present invention.
Figure 14:
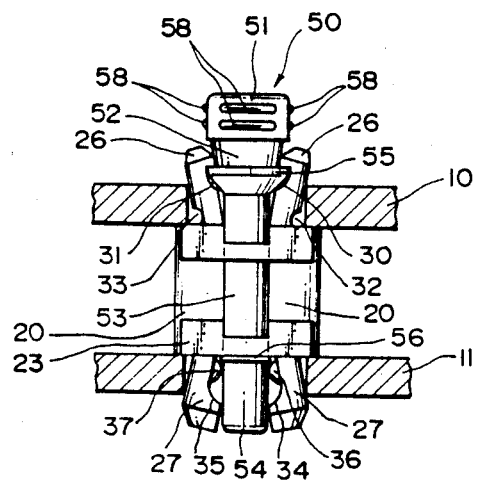
FIG. 14 is a side elevational view, partly in section, of the circuit board isolating fastener shown in FIG. 13.

FIGS. 13 and 14 show a circuit board isolating fastener according to a fifth preferred embodiment of the present invention. In the circuit board isolating fastener shown, a square head 51 of a plunger 50 has two parallel slipping preventing projections 58 formed on each of four side walls thereof, and an annular projection 56 is provided at a lower location of a rod 53. Meanwhile, a pair of projections 36 and 37 are formed in recesses 34 and 35, respectively, in opposing inner walls of a lower locking member 27 of a fastener body 15 adjacent a slit 29. The projections 36 and 37 are contacted by the annular projection 56 of the rod 53 of the plunger 50 and thus act as stoppers for assuring engagement of the plunger 50 with the fastener body 15.

Figure 15:
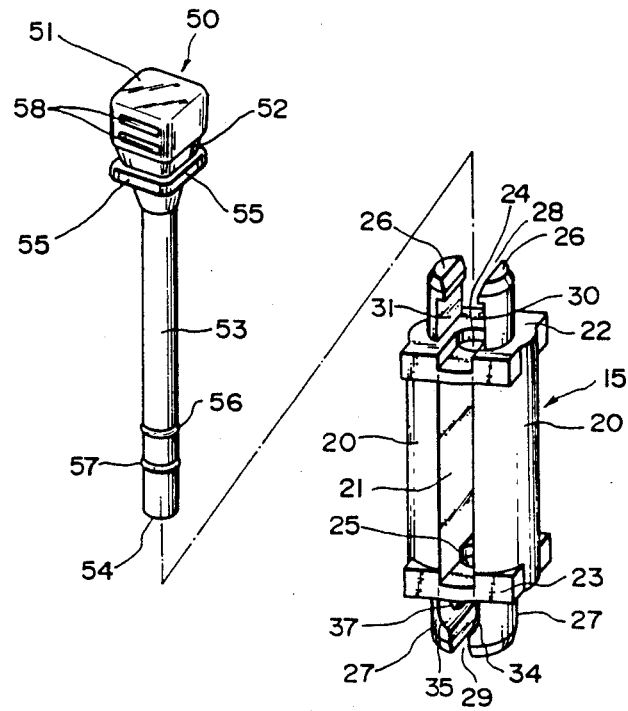
FIG. 15 is a fragmentary perspective view showing a yet further preferred embodiment of circuit board isolating fastener according to the present invention.
Figure 16:
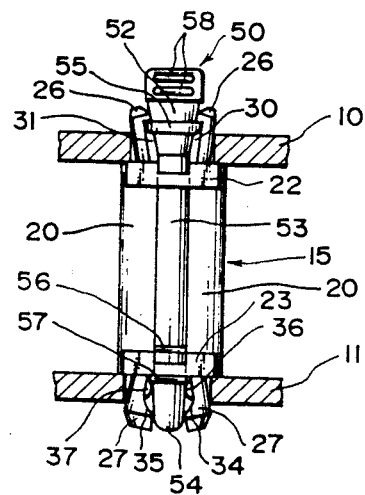
FIG. 16 is a side elevational view, partly in section, of the circuit board isolating fastener shown in FIG. 15.

FIGS. 15 and 16 show a circuit board isolating fastener according to a sixth preferred embodiment of the present invention wherein two annular projections 56 and 57 are formed on an outer periphery of a rod 53 of a plunger 50 for holding a lower support plate 23 of a fastener body 15 therebetween when the plunger 50 is fitted in the fastener body 15.

Referring to FIGS. 6, 8, 10, 12, 14 and 16, in use of a circuit board isolating fastener according to the present invention, at first the lower locking member 26 of the fastener body 15 is inserted into an opening of a chassis 11 to a position in which an outer side face of the support plate 23 of the fastener body 15 contacts with a surface of the chassis 11. Then, the upper locking member 26 of the fastener body 15 is inserted into an opening of a printed circuit board 10 until an outer side face of the support plate 22 of the fastener body 15 is contacted with a bottom face of the circuit board 10. After then, the plunger 50 is inserted into the guide hole 24 at the center of the upper support plate 22 of the fastener body 15 and further pushed into the guide hole 25 at the center of the lower support plate 23 through the opening 21 of the isolating member 20. Thereupon, the slit 29 of the lower locking member 27 is expanded outwardly by the end portion 54 of the rod 53 of the plunger 50 so that the outer side wall of the locking member 27 is pressed against an inner face of the opening of the chassis 11, thereby fixing the fastener body 15 to the chassis 11. At the same time, the slit 28 of the upper locking member 26 of the fastener body 15 is expanded outwardly by the side faces of the inverted pyramid-shaped portion 52 of the head 51 of the plunger 50 so that the outer side wall of the locking member 26 is pressed against an inner face of the opening of the circuit board 10, thereby fixing the fastener body 15 to the circuit board 10. In this instance, the projection 55 on the inverted pyramid-shaped portion 52 of the head 51 of the plunger 50 is fitted into the grooves 30 and 31 in the inner walls of the upper locking member 26 adjacent the slit 28, thereby completing the assembly of the plunger 50 to the fastener body 15. In any of the embodiments shown in FIGS. 5 to 12, the annular body 56 formed on the rod 53 of the plunger 50 is positioned just inside of the upper support plate 22 of the fastener body 15. To the contrary, in the embodiment shown in FIGS. 13 and 14, the annular projection 56 formed on the rod 53 of the plunger 50 is positioned just outside of the lower support plate 23, and in the embodiment shown in FIGS. 15 and 16, the annular projections 56 and 57 formed on the rod 53 of the plunger 50 are positioned just inside and outside of the lower support plate 23 of the fastener body 15, thereby preventing coming off of the plunger 50 from the fastener body 15.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A circuit board isolating fastener, comprising:
a fastener body comprising:
an isolating member having a longitudinal opening for receiving a plunger, said isolating member having a first longitudinal end and a second longitudinal end,
a first support plate and a second support plate, said first support plate and said second support plate each having an inner planar face, an outer planar face and a central opening extending transversely therethrough, wherein said first support plate is integrally connected to said first longitudinal end of said isolating member so that said central opening of said first support plate is coaxial with said longitudinal opening, and wherein said second support plate is integrally connected to said second longitudinal end of said isolating member so that said central opening of said second support plate is coaxial with said longitudinal opening,
a first expandable locking means integrally connected to said outer planar face of said first support plate, said first expandeble locking means comprising a pair of first locking tabs disposed on opposite sides of said central opening and defining a pair of parallel planar engagement surfaces therebetween, and
a second expandable locking means integrally connected to said outer planar face of said second support plate, said second expandable locking means comprising a pair of second locking tabs disposed on opposite sides of said central opening; and
a plunger removably insertable into said longitudinal opening of said fastener body, comprising an inverted pyramid-shaped head having four lateral planar engagement surfaces and an elongate rod extending downwardly therefrom;
wherein engagement means is provided on both of said parallel planar engagement surfaces of said first locking tabs, wherein complementary engagement means is provided on each of said four lateral planar engagement surfaces of said inverted pyramid-shaped head, and wherein said engagement means on said pair of parallel planar engagement surfaces engages with said complementary engagement means of two of said four lateral planar surfaces when said plunger is inserted into said fastener body so as to form a positive locking engagement therebetween.

2. A circuit board isolating fastener as claimed in claim 1, wherein said pair of first locking tabs have an exterior surface with a base portion defined proximate said outer face of said first support plate, and wherein a recess is defined in said base portion.

3. A circuit board isolating fastener as claimed in claim 1, wherein said plunger further comprises means for engaging the central opening of said first support plate comprising an annular projection formed on said elongate rod.

4. A circuit board isolating fastener as claimed in claim 3, wherein said plunger further comprises means for engaging the central opening of said second support plate comprising an annular projection formed on said elongate rod.

5. A circuit board isolating fastener as claimed in claim 1, wherein said plunger further comprises means for engaging the central opening of said second support plate comprising an annular projection formed on said elongate rod.

6. A circuit board isolating fastener as claimed in claim 1, wherein said plunger further comprises slip prevention means for facilitating gripping of the plunger disposed about a top portion of said inverted pyramind-shaped head.

7. A circuit board isolating fastener as claimed in claim 6, wherein said slip prevention means comprises a projection.

8. A circuit board isolating fastener as claimed in claim 6, wherein said slip prevention means comprises a recess.

9. A circuit board isolating feastener, comprising: a fastener body comprising:
   an isolating member having a longitudinal opening for receiving a plunger, said isolating member having a first longitudinal end and a second longitudinal end,
   a first support plate and a second support plate, said first support plate and said second support plate each having an inner planar face, an outer planar face and a central opening extending transversely therethrough, wherein said first support plate is integrally connected to said first longitudinal end of said isolating member so that said central opening of said first support plate is coaxial with said longitudinal opening, and wherein said second support plate is integrally connected to said second longitudinal end of said isolating member so that said central opening of said second support plate is coaxial with said longitudinal opening,
   a first expandable locking means integrally connected to said outer planar face of said first support plate, said first expandable locking means comprising a pair of first locking tabs disposed on opposite sides of said central opening and defining a pair of parallel planar engagement surfaces therebetween, and
   a second expandable locking means integrally connected to said outer planar face of said second support plate, said second expandable locking means comprising a pair of second locking tabs disposed on opposite sides of said central opening; and
   a plunger removably insertable into said longitudinal opening of said fastener body, comprising an inverted pyramid-shaped head having four lateral planar engagement surfaces and an elongate rod extending downwardly therefrom;
wherein engagement means is provided on both of said parallel planar engagement surfaces of said first locking tabs, wherein complementray engagement means is provided on each of said four lateral planar engagement surfaces of said inverted pyramid-shaped head, and wherein said engagement means on said pair of parallel planar engagement surface engages with said complementary engagement means of two of said four lateral planar surfaces when said plunger is inserted into said fastener body so as to form a positive locking engagement therebetween;
wherein said plunger further comprises means for engaging the central opening of said first support plate comprising an annular projection formed on said elongate rod and means for engaging the central opening of said second support plate comprising an annular projection formed on said elongate rod; and
wherein said plunger further comprises slip prevention means for facilitating gripping of the plunger disposed about a top portion of said inverted pyramid-shaped head.

* * * * *